United States Patent
Scott et al.

(10) Patent No.: US 6,624,449 B1
(45) Date of Patent: Sep. 23, 2003

(54) THREE TERMINAL EDGE ILLUMINATED EPILAYER WAVEGUIDE PHOTOTRANSISTOR

(76) Inventors: David C. Scott, 11332 E. 214th St., Lakewood, CA (US) 90715; Timothy A. Vang, 1004 Calle Carrillo, San Dimas, CA (US) 91773; Srinath Kalluri, 22681 Oak Grove Ave. #325, Aliso Viejo, CA (US) 92656

(*) Notice: Subject to any disclaimer, the term of this patent is extended or adjusted under 35 U.S.C. 154(b) by 0 days.

(21) Appl. No.: 09/907,317

(22) Filed: Jul. 17, 2001

(51) Int. Cl.[7] .................. H01L 31/0328; H01L 31/0336; H01L 31/06
(52) U.S. Cl. .................. 257/184; 257/185; 257/462
(58) Field of Search .................. 257/197, 200, 257/12, 565, 184, 185, 462, 464, 21, 189, 187; 438/48

(56) References Cited

U.S. PATENT DOCUMENTS

| | | | | |
|---|---|---|---|---|
| 5,150,185 A | * | 9/1992 | Yamada | 257/197 |
| 5,327,006 A | * | 7/1994 | Beasom | 257/583 |
| 5,920,773 A | * | 7/1999 | Hafizi et al. | 438/170 |
| 6,049,099 A | * | 4/2000 | Vaccaro et al. | 257/200 |
| 6,229,189 B1 | * | 5/2001 | Yap et al. | 257/414 |
| 6,355,947 B1 | * | 3/2002 | Niwa | 257/197 |
| 6,403,436 B1 | * | 6/2002 | Tanomura | 438/312 |
| 2001/0023947 A1 | * | 9/2001 | Gutierrez-Aitken et al. | 257/183 |
| 2002/0031892 A1 | * | 3/2002 | Delage et al. | 438/312 |

* cited by examiner

Primary Examiner—Amir Zarabian
Assistant Examiner—Kiesha Rose
(74) Attorney, Agent, or Firm—Parsons & Goltry; Robert A. Parsons; Michael W. Coltry

(57) ABSTRACT

A three terminal edge illuminated epilayer waveguide phototransistor including a subcollector layer formed of an epitaxially grown quaternary semiconductor material, such as heavily doped InGaAsP. A collector region of undoped InGaAs is epitaxially grown on the subcollector layer. A base region, including a heavily doped InGaAs base layer and a very thin undoped InGaAs spacer layer, is epitaxially grown on the collector layer. An emitter region, including a doped InGaAsP layer, a doped InP layer, and a heavily doped InGaAs emitter contact layer, is epitaxially grown on the base layer. The various layers and regions are formed so as to define an edge-illuminated facet for receiving incident light.

21 Claims, 1 Drawing Sheet

THREE TERMINAL EDGE ILLUMINATED EPILAYER WAVEGUIDE PHOTOTRANSISTOR

FIELD OF THE INVENTION

This invention relates to phototransistors.

More particularly, the present invention relates to three terminal edge illuminated heterojunction bipolar phototransistors (HBPTs).

BACKGROUND OF THE INVENTION

As the bit rates of telecommunication and data communication systems increase, the demands on the performance requirements of photoreceivers increases. As bit rates extend beyond 40 Gbit/s, the sensitivity of optical receivers tends to decrease causing degradation in the overall performance of the optical communications link. Receiver sensitivity has been improved in prior art by implementing avalanche photodetectors (APDs) as the optical detection element. This improvement in receiver sensitivity has been due to the fact that APDs can provide internal optical to electrical gain through the avalanche multiplication process. Some of the problems associated with implementing APDs in the receiver circuits are that the avalanche multiplication process is an inherently noisy process and requires excessively high bias voltages on the order of 40 volts to achieve the desired gain. The high electric fields that result from these excessively high bias voltages lead to reliability problems that cause premature failure. Many engineering solutions need to be implemented to circumvent these issues. As such, the fabrication and device layer profile are highly specialized for the APD, which prevents the monolithic integration of the APD with the transimpedance amplifier (TIA) circuit. The resulting consequence of this specialization is that it is unlikely that front-end optical receivers that are based on APDs will be able to operate at 40 Gbps bit rates or beyond due to the excessive parasitic losses that come from the hybrid integration of the APD with the rest of the circuit.

What is desired at these high bit rates is a solution that can improve the sensitivity of the receiver by providing internal optical to electrical gain without the excessive noise characteristics of the APD and without the excessive bias voltages. In addition, a detector that can be easily monolithically integrated with the rest of the receiver electronics would greatly reduce the parasitic losses associated with a hybrid interconnection and further increase the performance of the receiver.

It would be highly advantageous, therefore, to remedy the foregoing and other deficiencies inherent in the prior art.

Accordingly, it is an object of the present invention to provide a new and improved three terminal edge illuminated heterojunction bipolar phototransistor.

It is an object of the present invention to provide a new and improved three terminal edge illuminated heterojunction bipolar phototransistor which decreases the excessive parasitic losses.

It is another object of the present invention to provide a new and improved three terminal edge illuminated heterojunction bipolar phototransistor which allows it to be monolithically integrated with the receiver circuitry.

It is another object of the present invention to provide a new and improved three terminal edge illuminated heterojunction bipolar phototransistor which has a short carrier transit-time.

And another object of the invention is to provide a new and improved three terminal edge illuminated heterojunction bipolar phototransistor which has a high internal quantum efficiency.

Still another object of the present invention is to provide a new and improved three terminal edge illuminated heterojunction bipolar phototransistor which has a high external coupling efficiency.

A further object of the invention is to provide a new and improved three terminal edge illuminated heterojunction bipolar phototransistor which has the ability to perform at bit rates greater than 40 Gbits/second.

SUMMARY OF THE INVENTION

To achieve the objects and advantages specified above and others, an edge illuminated epilayer waveguide phototransistor (hereinafter referred to as "WPT") is disclosed which includes a subcollector layer formed from an epitaxially grown quaternary semiconductor material that is grown on a semiconductor substrate. The epitaxially grown quaternary semiconductor material improves the optical waveguide mode properties. A collector region is epitaxially grown on the subcollector layer. A base region is epitaxially grown on the collector layer. A very thin spacer layer is grown between the base and emitter layers. An emitter region is then epitaxially grown on the spacer layer. The various layers and regions are formed so as to define an edge-illuminated facet for receiving incident light. Further, ohmic contacts are formed to the subcollector, base, and emitter regions to allow electrical signals to be extracted from the phototransistor. In a preferred embodiment, the subcollector region consists of an InGaAsP quaternary semiconductor with a composition that corresponds to a bandgap wavelength of 1.15 µm. The InGaAsP subcollector is a unique advantage that allows the optimization of the input optical coupling efficiency without sacrificing the phototransistor' electrical performance. The InGaAsP subcollector expands the optical mode in the vertical direction, which increases the input mode coupling efficiency to commercially available lensed optical fibers without degrading the electrical properties of the device. The heavily doped InGaAsP subcollector also maintains the necessary electrical characteristics needed for high performance device operation.

The WPT discussed here will eliminate all of the previously mentioned issues associated with the APD due to superior noise performance and reduced bias voltage requirement (2 volts). In addition, by optimizing the layer structure of the WPT, the device can be monolithically integrated with receiver circuits consisting of InP-based HBTs resulting in a low-cost, high performance receiver. This is due to the fact that the epilayer profile can be defined to simultaneously optimize the performance of the WPT and the HBT on the same wafer. Also, the WPT uses a subcollector region that expands the optical mode size vertically without degrading the electrical properties of the device. Expanding the optical mode size in this manner increases the input optical coupling efficiency.

The WPT geometry has inherent advantages over top-illuminated phototransistors that have been demonstrated in the prior art. Some problems associated with the top-illuminated approach include the fact that the thickness of the absorbing layers must be increased to above 1 µm in order to absorb greater than 90% of the incident light. This leads to poor frequency response of the top-illuminated phototransistor due to the excessive base and collector carrier transit-times. The waveguide phototransistor geometry solves this problem because the light propagates and gets absorbed down the length of the device in a direction that is orthogonal to the flow of electrical carriers. As such, the thickness of the absorbing layers can be kept small such that the base and collector transit-times are short which allows for high-speed operation.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which the single FIGURE is a isometric view of a three terminal edge illuminated epilayer waveguide phototransistor in accordance with the present invention.

DETAILED DESCRIPTION OF THE PREFERRED EMBODIMENT

Figure 1:
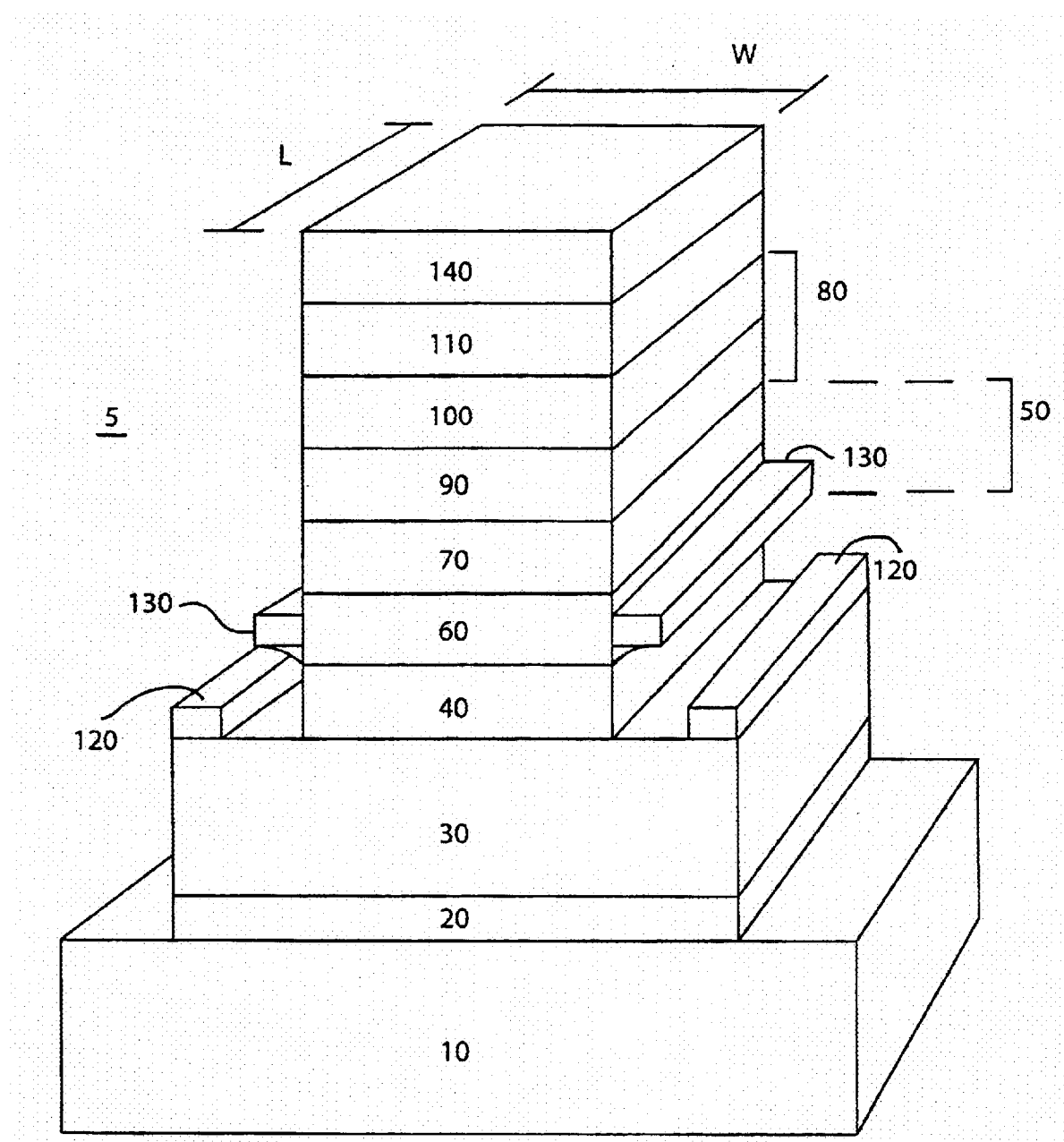

Turn now to the drawing which illustrates an isometric cross sectional view of a three terminal edge illuminated epilayer waveguide phototransistor 5 in accordance with the present invention. Three terminal edge illuminated epilayer waveguide phototransistor 5 includes a substrate 10 which in this embodiment is formed of semi-insulating InP. It will be understood that the substrate 10 can be any convenient material that is compatible with layers subsequently grown thereon. A buffer layer 20 can be included to provide a pristine surface onto which the device structure can be grown with minimal defects. In this preferred embodiment the buffer layer 20 is composed of InP and is approximately 0.1 $\mu$m thick. It will be understood that buffer the layer 20 can be the same material as the substrate 10 or can be composed of an alloy to allow lattice matching to subsequent layers grown thereon. A subcollector layer 30 is then epitaxially grown on area 20. In this preferred embodiment, the subcollector layer 30 consists of a heavily n-type doped InGaAsP quaternary alloy with a composition that corresponds to a bandgap wavelength of 1.15 $\mu$m. The alloy composition of the InGaAsP quaternary is chosen so that it is transparent to the optical wavelengths of interest. It will be understood that subcollector layer 30 can be composed of any quaternary material that allows the desired device performance. Also, in this preferred embodiment, subcollector layer 30 is approximately 0.85 $\mu$m thick, which allows low sheet resistance values (about 20 $\Omega$/square).

The combination of using heavily doped InGaAsP of this composition and a thick subcollector layer 30 allows the achievement of low sheet and contact resistances needed for high-speed device operation. The key reason for using the transparent InGaAsP quaternary for the subcollector is that it expands the optical mode in the vertical direction and thereby increases the input mode coupling from commercially available lensed optical fibers.

A collector layer 40 is epitaxially grown on subcollector layer 30. In this preferred embodiment, collector layer 40 is composed of undoped InGaAs and is approximately 0.4 $\mu$m thick. The material comprising collector layer 40 is chosen such that it absorbs the optical wavelengths of interest. It will be understood that collector layer 40 can be composed of any material that allows the desired device performance. The thickness of the collector layer 40 is chosen to obtain the desired transit frequency, breakdown voltage, base-collector capacitance, and rate of optical absorption. The collector layer 40 thickness of 0.4 $\mu$m allows transit frequencies of approximately 130 GHz, which is needed for 40 Gbps data transmission rates.

A base region 50 is then epitaxially grown on collector layer 40. In this preferred embodiment, the base region 50 consists of a heavily p-type doped InGaAs base region 60, which is approximately 0.05 $\mu$m thick, onto which an undoped InGaAs base layer 70 is epitaxially grown. Undoped InGaAs base layer 70 is approximately 50 Å thick. The thickness of the heavily p-type doped InGaAs base region 60 was chosen as a tradeoff between obtaining the desired base sheet resistance and base transit time. An emitter region 80 is then epitaxially grown on the undoped InGaAs base layer 70. The undoped InGaAs base layer 70 acts as a spacer that reduces the amount of base dopant diffusion into emitter region 80. Emitter region 80 consists of an n-type doped InGaAsP emitter layer 90 which is approximately 0.1 $\mu$m thick onto which an n-type doped InP emitter layer 100 is epitaxially grown. The n-type doped InP emitter layer 100 is approximately 0.5 $\mu$m thick. The composition of the n-type doped InGaAsP emitter layer 90 is chosen so that the bandgap wavelength is approximately 1.15 $\mu$m, which is required to center the optical mode with collector layer 40 and base region 50. Centering the optical mode increases the rate of optical absorption.

An ohmic emitter contact layer 110 is then deposited onto the n-type doped InP emitter layer 100. In this preferred embodiment, the ohmic emitter contact layer 110 is composed of heavily n-type doped InGaAs and is approximately 0.05 $\mu$m thick. The thickness of the n-type doped InP emitter layer 100 is chosen to prevent the optical mode from overlapping the ohmic emitter contact layer 110 and causing unwanted optical loss reducing the optical to electrical conversion efficiency of the device.

It will be understood that many different configurations can be used to produce the base and emitter regions, including using multiple layers of various semiconductor alloys or by using different doping configurations.

Finally, ohmic contacts need to be provided to ohmic emitter contact layer 110, base region 60, and subcollector layer 30. Ohmic contacts are made by etching the device down toward the surface of the heavily p-type doped InGaAs base region 60. This results in an emitter mesa of width, W, and length, L. The width in the preferred embodiment is chosen to be approximately 2 $\mu$m which allows for good input optical coupling efficiency from commercially available lensed optical fibers. The width could be made smaller to improve the speed of the device, but this would reduce the input optical coupling efficiency.

An ohmic emitter metallization region 140 and an ohmic base metallization region 130 are formed on the ohmic emitter contact layer 110 and the heavily p-type doped InGaAs base region 60, respectively. In the preferred embodiment, the ohmic emitter metallization region 140 and the ohmic base metallization region 130 are comprised of a Ti/Pt/Au layer structure. Ohmic emitter metallization region 140 is deposited on the surface of the ohmic emitter contact layer 110 and the heavily p-type doped InGaAs base region 60 using a standard self-aligned metallization process. In short, the ohmic emitter metallization region 140 and the ohmic base metallization region 130 separate due to the slight undercut of the emitter mesa and due to the ratio of the height of the mesa to the thickness of the metallization. Ohmic base metallization region 130 is self-aligned to the emitter region 80 to minimize the lateral extrinsic base resistance. A wet etching technique is then used to etch collector layer 40 down to subcollector layer 30. Ohmic base metallization region 130 behaves as a mask to the wet etching chemicals and causes an undercut to be developed in collector layer 40. The undercut allows a portion of the heavily p-type doped InGaAs base region 60 to extend out over subcollector layer 30. Ohmic base metallization region 130 is then supported by the portion of the heavily p-type doped InGaAs base region 60 that extends out over subcollector layer 30. Undercutting the collector layer 40 minimizes the base-collector capacitance in the edge-illuminated epilayer waveguide phototransistor 5. Reducing the base-collector capacitance improves the speed of the device and also makes the shape of the optical mode more circular, which improves the input optical coupling efficiency.

An AuGe ohmic subcollector metallization layer 120 is then deposited on subcollector layer 30. Subcollector layer 30 is then etched down to substrate 10 to electrically isolate the device. Subcollector layer 30, collector layer 40, base region 50, and emitter region 80 are formed so as to define an edge-illuminated facet 145 for receiving incident light.

In addition to considering the electrical properties of the edge-illuminated epilayer waveguide phototransistor 5, it is necessary to consider the optical properties as well. Collector layer 40 and base region 50 both serve as the region of optical absorption. Hence, the thickness of collector layer 40 and base region 50 need to be such that all of the light is absorbed after it impinges through the edge-illuminated facet 145 and travels down the length of collector layer 40 and base region 50. A collector layer with thickness of 0.4 $\mu$m gives an internal quantum efficiency of greater than 90% for collector lengths approximately 7 $\mu$m. An internal quantum efficiency of greater than 90% is sufficient for device operation.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. Edge illuminated epilayer waveguide phototransistor comprising:
    a subcollector layer formed of an epitaxially grown quaternary semiconductor;
    a collector region epitaxially grown on the subcollector layer;
    a base region epitaxially grown on the collector layer;
    an emitter region epitaxially grown on the base layer; and
    the subcollector layer, the collector region, the base region, and the emitter region being formed so as to define an edge illuminated facet for receiving incident light.

2. Edge illuminated epilayer waveguide phototransistor as claimed in claim 1 wherein the subcollector layer is epitaxially grown on an InP substrate.

3. Edge illuminated epilayer waveguide phototransistor as claimed in claim 2 wherein the subcollector layer is composed of InGaAsP.

4. Edge illuminated epilayer waveguide phototransistor as claimed in claim 3 wherein the InGaAsP subcollector layer includes a composition that is transparent at the optical wavelengths of interest.

5. Edge illuminated epilayer waveguide phototransistor as claimed in claim 4 wherein the InGaAsP subcollector layer includes a InGaAsP composition that corresponds to a band gap wavelength of 1.15 $\mu$m.

6. Edge illuminated epilayer waveguide phototransistor as claimed in claim 1 wherein the subcollector layer has a thickness in a range of approximately 0.80 $\mu$m to 0.90 $\mu$m.

7. Edge illuminated epilayer waveguide phototransistor as claimed in claim 6 wherein the subcollector layer is doped to provide a sheet resistance value in a range of 20 $\Omega$/square to 30 $\Omega$/square.

8. Edge illuminated epilayer waveguide phototransistor as claimed in claim 1 wherein the collector region includes an undoped InGaAs layer with a thickness chosen to optimize the transit frequency, breakdown voltage, base-collector capacitance, and rate of optical absorption.

9. Edge illuminated epilayer waveguide phototransistor as claimed in claim 8 wherein the collector region thickness is in a range of 0.3 $\mu$m to 0.5 $\mu$m.

10. Edge illuminated epilayer waveguide phototransistor as claimed in claim 8 wherein the collector region thickness is approximately 0.4 $\mu$m.

11. Edge illuminated epilayer waveguide phototransistor as claimed in claim 8 wherein the collector region thickness is chosen to provide a transit frequency of approximately 130 GHz.

12. Edge illuminated epilayer waveguide phototransistor as claimed in claim 8 wherein the collector region has a length selected to provide an internal quantum efficiency greater than 90%.

13. Edge illuminated epilayer waveguide phototransistor as claimed in claim 1 wherein the base region includes a doped base layer and an undoped spacer layer.

14. Edge illuminated epilayer waveguide phototransistor as claimed in claim 13 wherein the collector region is undercut below the base region, reducing the width of the collector region to minimize base-collector capacitance.

15. Edge illuminated epilayer waveguide phototransistor as claimed in claim 3 wherein the emitter region includes a layer of InGaAsP and a layer of InP.

16. Edge illuminated epilayer waveguide phototransistor as claimed in claim 15 wherein the layer of InGaAsP has a thickness in a range of approximately 0.05 $\mu$m to 0.15 $\mu$m.

17. Edge illuminated epilayer waveguide phototransistor as claimed in claim 16 wherein the InP emitter layer has a thickness large enough to prevent optical absorption loss in the top InGaAs emitter contact layer.

18. Edge illuminated epilayer waveguide phototransistor as claimed in claim 17 wherein the InP emitter layer has a thickness of approximately 0.5 $\mu$m.

19. Edge illuminated epilayer waveguide phototransistor as claimed in claim 15 wherein the emitter region further includes a contact layer of InGaAs.

20. Edge illuminated epilayer waveguide phototransistor comprising:
    a subcollector layer formed of doped InGaAsP with a thickness in a range of 0.80 $\mu$m to 0.90 $\mu$m;
    a collector layer of undoped InGaAs with a thickness in a range of 0.3 $\mu$m to 0.5 $\mu$m epitaxially grown on the subcollector layer;
    a base region including a doped InGaAs layer epitaxially grown on the collector layer having a thickness of approximately 0.05 $\mu$m and an undoped InGaAs layer having a thickness of approximately 50 Å, epitaxially grown on the doped InGaAs layer;
    an emitter region including a doped InGaAsP layer having a thickness in a range of 0.05 $\mu$m to 0.15 $\mu$m and epitaxially grown on the undoped InGaAs layer of the base region, a doped InP layer having a thickness in a range of 0.3 $\mu$m to 0.7 $\mu$m epitaxially grown on the doped InGaAsP layer, and a doped InGaAs emitter contact layer epitaxially grown on the doped InP layer; and
    the subcollector layer, the collector layer, the base region, and the emitter region being formed so as to define an edge illuminated facet for receiving incident light.

21. Edge illuminated epilayer waveguide phototransistor as claimed in claim 20 wherein the subcollector layer, the collector layer, the base region, and the emitter region define a mesa having a width in a range of 1.0 $\mu$m to 5.0 $\mu$m and a length long enough to achieve a greater than 90% internal optical absorption efficiency.

* * * * *